US007912228B2

(12) United States Patent
Finn et al.

(10) Patent No.: US 7,912,228 B2
(45) **Date of Patent: *Mar. 22, 2011**

(54) DEVICE AND METHOD FOR OPERATING VOICE-SUPPORTED SYSTEMS IN MOTOR VEHICLES

(75) Inventors: Brian Michael Finn, East Palo Alto, CA (US); Shawn K. Steenhagen, Cottage Grove, WI (US)

(73) Assignees: Volkswagen AG, Wolfsburg (DE); Audi AG, Ingolstadt (DE)

( * ) Notice: Subject to any disclaimer, the term of this patent is extended or adjusted under 35 U.S.C. 154(b) by 1953 days.

This patent is subject to a terminal disclaimer.

(21) Appl. No.: 10/623,286

(22) Filed: Jul. 18, 2003

(65) Prior Publication Data

US 2005/0013451 A1 Jan. 20, 2005

(51) Int. Cl.

| | |
|---|---|
| ***H04B 1/00*** | (2006.01) |
| ***H04B 15/00*** | (2006.01) |
| ***H04R 3/00*** | (2006.01) |
| ***H04R 27/00*** | (2006.01) |
| ***H03B 29/00*** | (2006.01) |
| ***G10L 19/14*** | (2006.01) |
| ***H04M 1/00*** | (2006.01) |

(52) U.S. Cl. ................ 381/86; 381/92; 381/83; 381/93; 381/122; 381/71.4; 381/94.1; 700/94; 704/224; 704/205; 455/569.2

(58) Field of Classification Search .................... 381/83, 381/86, 93, 98, 110, 99, 71.1, 71.4, 94.1–94.7, 381/92, 111, 122; 704/205, 224; 700/94; 455/569.2, 41.2

See application file for complete search history.

(56) References Cited

U.S. PATENT DOCUMENTS

| | | | | |
|---|---|---|---|---|
| 5,245,665 | A | 9/1993 | Lewis et al. | |
| 5,442,712 | A * | 8/1995 | Kawamura et al. | 381/83 |
| 5,677,987 | A * | 10/1997 | Seki et al. | 704/226 |
| 6,125,187 | A * | 9/2000 | Hanajima et al. | 381/83 |
| 6,252,969 | B1 * | 6/2001 | Ando | 381/103 |
| 6,385,176 | B1 | 5/2002 | Lyengar et al. | |
| 6,535,609 | B1 | 3/2003 | Finn et al. | |
| 6,674,865 | B1 * | 1/2004 | Venkatesh et al. | 381/107 |
| 2004/0158460 | A1 * | 8/2004 | Finn et al. | 704/205 |

FOREIGN PATENT DOCUMENTS

| | | |
|---|---|---|
| DE | 39 25 589 | 2/1991 |
| DE | 41 06 405 | 9/1991 |
| DE | 197 05 471 | 7/1997 |
| DE | 199 58 836 | 5/2001 |
| EP | 0 078 014 | 8/1986 |
| EP | 0 599 450 | 6/1994 |
| EP | 1 077 013 | 3/2002 |
| EP | 1 445 761 | 1/2004 |
| WO | WO 97/34290 | 9/1997 |
| WO | WO 02/21817 | 3/2002 |
| WO | WO 02/069487 | 9/2002 |
| WO | WO 03/079721 | 9/2003 |

* cited by examiner

*Primary Examiner* — Devona E Faulk
(74) *Attorney, Agent, or Firm* — Kenyon & Kenyon LLP

(57) ABSTRACT

In a method and equipment for operating a voice-supported system, such as a communications and/or intercom/two-way intercom device in a motor vehicle, using at least one microphone and at least one loudspeaker to reproduce a signal generated by the microphone, as well as a bandpass filter configured between the microphone and the loudspeaker, a power of the signal as a function of a frequency is determined, and the bandpass filter is adjusted as a function of at least one local maximum of the power of the signal as a function of the frequency.

34 Claims, 7 Drawing Sheets

DEVICE AND METHOD FOR OPERATING VOICE-SUPPORTED SYSTEMS IN MOTOR VEHICLES

FIELD OF THE INVENTION

The present invention relates to a method and to a device for operating voice-enhancement systems, such as communication and/or intercom/two-way intercom and/or duplex telephony devices in motor vehicles, where voice signals are picked up via a microphone system and routed to at least one loudspeaker.

BACKGROUND INFORMATION

Methods of this kind are used in motor vehicles for voice-supported duplex telephony or for supporting voice input-controlled electronic or electrical components. The fundamental difficulty that arises is that, depending on the particular operating state, there is background noise in the motor vehicle. This masks the voice commands. Intercom and two-way intercom systems in motor vehicles are mainly advantageously used in large vehicles, minibusses and the like. However, they can also be used in normal passenger cars. When using voice-controlled input units for electrical components in motor vehicles, it is still very important for the background noise to be suppressed or for the voice command to be filtered out.

Thus, a voice-recognition device for a motor vehicle is described in European Patent Application No. 0 078 014, where the status of engine operation and/or motor vehicle movement is signaled or fed in, via sensors, to the amplifier system of the voice-recognition device. Based on this, a noise-level control is then used to attempt to filter out the voice command from the background noise.

A filtering operation is described in PCT International Published Patent Application No. WO 97/34290, where periodic interfering noise signals are filtered out by determining their periods and by using a generator to interfere with them, so that the voice signal remains.

In German Published Patent Application No. 197 05 471, it is described to support a voice recognition with the aid of transversal filtering.

In German Published Patent Application No. 41 06 405, a method is described for subtracting noise from the voice signal, a multiplicity of microphones being used. A duplex telephony device having a plurality of microphones is discussed in German Published Patent Application No. 199 58 836.

In German Published Patent Application No. 39 25 589, it is described to use a multiple microphone system, where, in motor vehicle applications, one of the microphones is placed in the engine compartment and one other microphone in the passenger compartment. A subtraction of both signals then follows. The disadvantage in this context is that only the engine noise or the actual running noise of the vehicle itself is subtracted from the total signal in the passenger compartment. Specific secondary noises are disregarded in this case. Also lacking is a feedback suppression. Everywhere that microphones and loudspeakers are placed in an acoustically coupleable vicinity, the acoustic signal that is extracted, coupled out or decoupled at the loudspeaker is fed back into the microphone. The result is a so-called feedback, and a subsequent overmodulation. Methods for avoiding such an overmodulation are described in European Published Patent Application No. 1 077 013, PCT International Published Patent Application No. WO 02/069487, and PCT International Published Patent Application No. WO 02/21817.

It is an object of the present invention to provide a method and a device that may improve the verbal communication among the occupants of a vehicle.

SUMMARY

The above and other beneficial objects of the present invention may be achieved by providing a method and a device as described herein.

The above object may be attained in that, for the operation of a voice-supported system, such as a communications and/or duplex telephony device in a motor vehicle, using at least one microphone and at least one loudspeaker to reproduce a signal generated by the microphone, as well as using a bandpass filter arranged between the microphone and the loudspeaker, the power of a signal is determined as a function of a frequency, and the bandpass filter is adjusted or set as a function of at least one local maximum of the power of the signal as a function of the frequency.

A local maximum of the power of the signal as a function of the frequency may include also the global maximum of the power of the signal as a function of the frequency.

In an example embodiment of the present invention, the local maximum of the power of the signal may be determined as a function of a derivative, e.g., the first derivative, of the power of the signal with respect to the frequency.

In an example embodiment of the present invention, an edge or slope signal may be formed using the first derivative of the power of the signal with respect to the frequency, which takes on a first binary value when the first derivative of the power of the signal with respect to the frequency is greater than or equal to zero, and which takes on a second binary value when the first derivative of the power of the signal with respect to the frequency is less than zero, the local maximum of the power of the signal being determined as a function of the first derivative of the slope signal.

In an example embodiment of the present invention, the presence of a local maximum of the power of the signal may only be assumed if the first derivative of the slope signal is less than zero.

The foregoing object may additionally be attained in that, for the operation of a voice-supported system, such as a communications and/or duplex telephony device in a motor vehicle, using at least one microphone and at least one loudspeaker to reproduce a signal generated by the microphone, as well as using a bandpass filter arranged between the microphone and the loudspeaker, the power of a signal may be determined as a function of a frequency, and the bandpass filter may be adjusted as a function of a derivative of the power of the signal with respect to the frequency.

In an example embodiment of the present invention, the bandpass filter may be adjusted as a function of at least two local maxima of the power of the signal as a function of the frequency.

In an example embodiment of the present invention, the bandpass filter may be adjusted as a function of the first derivative of the power of the signal with respect to the frequency.

In an example embodiment of the present invention, a slope signal may be formed using the first derivative of the power of the signal with respect to the frequency, which takes on a first binary value when the first derivative of the power of the signal with respect to the frequency is greater than or equal to zero, and which takes on a second binary value when the first derivative of the power of the signal with respect to the frequency is less than zero, the bandpass filter being adjusted as a function of the slope signal or of the first derivative of the slope signal.

In an example embodiment of the present invention, all local maxima may be determined in one frequency range. In an example embodiment of the present invention, the global maximum may be determined in that frequency range.

In an example embodiment of the present invention, the bandpass filter may be adjusted so that it blocks the portion of the signal generated by the microphone at a notch frequency only when the ratio:

at least of the power of the signal generated by the microphone at the frequency at which the power of the signal generated by the microphone is a maximum to the average value of the power of the signal generated by the microphone at additional frequencies of the signal generated by the microphone is greater than a feedback-power threshold (ratio threshold, OutGrdRatioThreshold).

In an example embodiment of the present invention, the bandpass filter may be adjusted so that it blocks the portion of the signal generated by the microphone at a notch frequency only when the ratio:

at least of the power of the signal generated by the microphone at the frequency at which the power of the signal generated by the microphone is a maximum to the average value of the power of the signal generated by the microphone at additional frequencies of the signal generated by the microphone is greater than a feedback-power threshold (RatioThreshold, OutGrdRatioThreshold) for longer than a time-ratio threshold (BinRatioTimeThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum, plus/or of the power of the signal generated by the microphone at one of the further frequencies of the signal generated by the microphone which are adjacent to the frequency at which the power of the signal generated by the microphone is a maximum to the average value of the power of the signal generated by the microphone at additional frequencies of the signal generated by the microphone is greater than a feedback-power threshold (RatioThreshold, OutGrdRatioThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum, plus/or of the power of the signal generated by the microphone at one of the further frequencies of the signal generated by the microphone which are adjacent to the frequency at which the power of the signal generated by the microphone is a maximum to the average value of the power of the signal generated by the microphone at additional frequencies of the signal generated by the microphone is greater than a feedback-power threshold (RatioThreshold, OutGrdRatioThreshold) for longer than a time-ratio-threshold (BinRatioTimeThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum, plus/or the power of the signal generated by the microphone at the frequency of the signal generated by the microphone:

which is directly adjacent to the frequency at which the power of the signal generated by the microphone is a maximum; and at which the power is greater than at a frequency which is also directly adjacent to the frequency at which the power of the signal generated by the microphone is a maximum to the average value of the power of the signal generated by the microphone at additional frequencies of the signal generated by the microphone is greater than a feedback-power threshold (RatioThreshold, OutGrdRatioThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum, plus/or the power of the signal generated by the microphone at the frequency of the signal generated by the microphone:

which is directly adjacent to the frequency at which the power of the signal generated by the microphone is a maximum; and at which the power is greater than at a frequency which is also directly adjacent to the frequency at which the power of the signal generated by the microphone is a maximum to the average value of the power of the signal generated by the microphone at additional frequencies of the signal generated by the microphone is greater than a feedback-power threshold (RatioThreshold, OutGrdRatioThreshold) for longer than a time-ratio-threshold (BinRatioTimeThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum, plus the power of the signal generated by the microphone at the frequency of the signal generated by the microphone:

which is directly adjacent to the frequency at which the power of the signal generated by the microphone is a maximum; and at which the power is greater than at a frequency which is also directly adjacent to the frequency at which the power of the signal generated by the microphone is a maximum to the average value of the power of the signal generated by the microphone of all, at least essential, additional (investigated) frequencies of the signal generated by the microphone is greater than a feedback-power threshold (RatioThreshold, OutGrdRatioThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum, plus the power of the signal generated by the microphone at the frequency of the signal generated by the microphone:

which is directly adjacent to the frequency at which the power of the signal generated by the microphone is a maximum; and at which the power is greater than at a frequency which is also directly adjacent to the frequency at which the power of the signal generated by the microphone is a maximum to the average value of the power of the signal generated by the microphone of all, at least essential, additional (investigated) frequencies of the signal generated by the microphone is greater than a feedback-power threshold (RatioThreshold, OutGrdRatioThreshold) for longer than a time-ratio-threshold (BinRatioTimeThreshold).

In an example embodiment of the present invention, the feedback-power threshold (RatioThreshold, OutGrdRatioThreshold) may be established as a function of an output signal of the bandpass filter.

In an example embodiment of the present invention, the feedback-power threshold (RatioThreshold, OutGrdRatioThreshold) may be between 20 and 40.

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum to the average value of the power of the signal generated by the microphone at further frequencies at which the power of the signal generated by the microphone has a local maximum is greater than an additional power threshold (RichContentThreshold).

In an example embodiment of the present invention, the bandpass filter may be adjusted so that it blocks the portion of the signal generated by the microphone at a notch frequency only when the ratio:

of the power of the signal generated by the microphone at the frequency at which the power of the signal generated by the microphone is a maximum to the average value of the power of the signal generated by the microphone at all further (investigated) frequencies at which the power of the signal generated by the microphone has a local maximum is greater than an additional power threshold (RichContentThreshold).

The power of the signal generated by the microphone at the frequency at which the power of the signal generated by the microphone is a maximum, and/or the power of the signal generated by the microphone at a frequency at which the power of the signal generated by the microphone has a local maximum, in the sense of the foregoing, may include alternatively or additionally also the power that the signal has in response to a closely adjacent frequency of above-named frequency and which (still) has a similar high power, such as the maximum in each case.

In an example embodiment of the present invention, the additional power threshold (RichContentThreshold) may be between 20 and 50, e.g., between 30 and 40.

In an example embodiment of the present invention, the bandpass filter may be adjusted as a function of its output signal.

In an example embodiment of the present invention, the bandpass filter may include a notch filter or a filter bank, e.g., a multifilter, having at least one notch filter. The filter bank may include, for example, 10 notch filters.

Further aspects, features and details are set forth below in the following description of exemplary embodiments.

DETAILED DESCRIPTION

Figure 1:
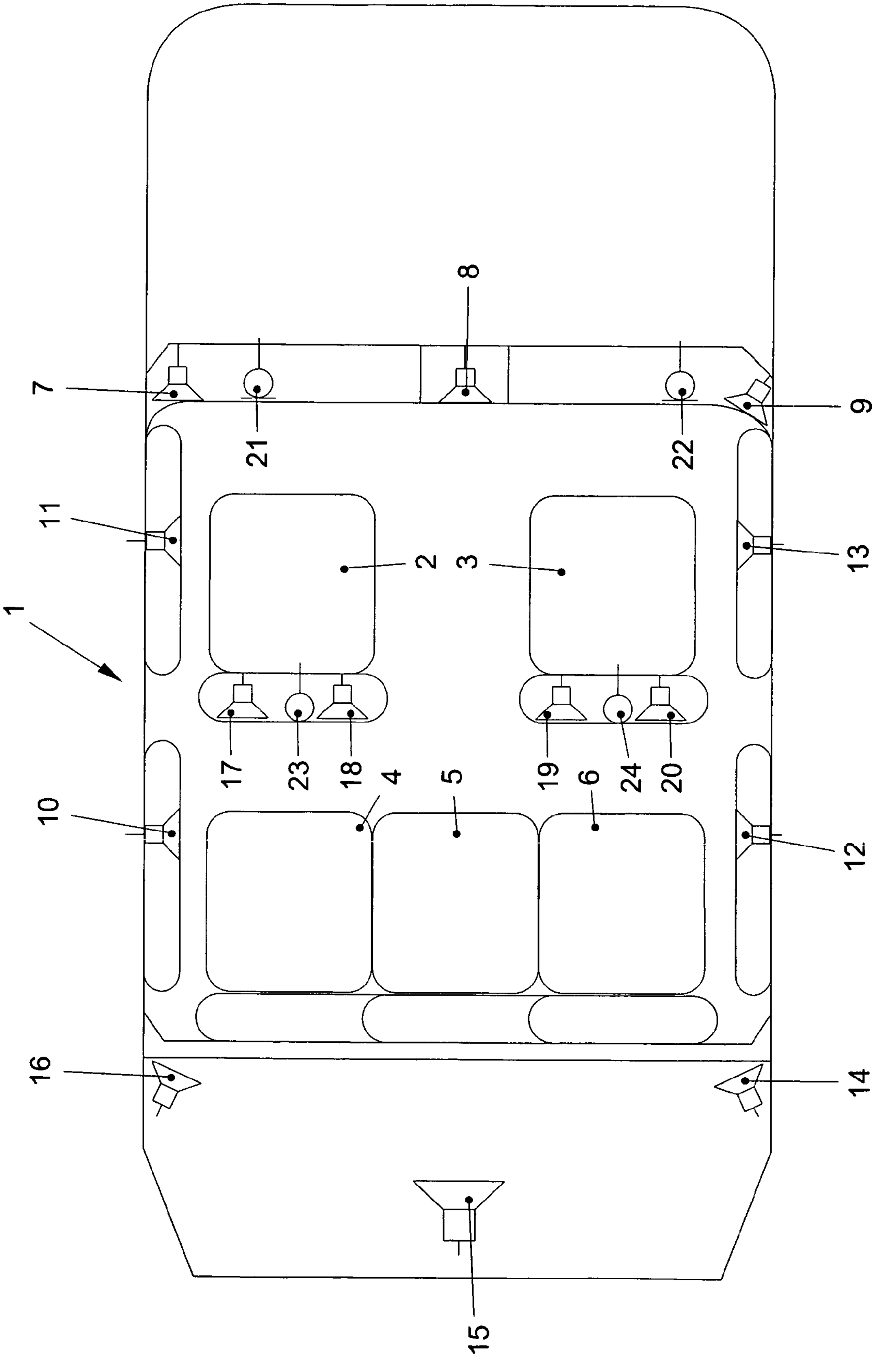
FIG. 1 illustrates a motor vehicle.

FIG. 1 is a schematic inside view of a motor vehicle 1 from above. In this context, reference numerals 2 and 3 indicate the front seats, and reference numerals 4, 5 and 6 indicate the rear seats of the motor vehicle. Reference numerals 7, 8, 9, 10, 11, 12, 13, 14, 15, 16, 17, 18, 19 and 20 indicate loudspeakers. Reference numerals 21, 22, 23 and 24 indicate microphones. Loudspeakers 7, 8, 9, 10, 11, 12, 13, 14, 15, 16, 17, 18, 19 and 20 belong, in part, to a music system and, in part, to a communication and/or intercom/two-way intercom device. They may also be used by both systems.

In the present exemplary embodiment, loudspeakers 9, 17, 18, 19, 20 output a signal generated by microphone 21, loudspeakers 7, 17, 18, 19, 20 output a signal generated by microphone 22, loudspeakers 7, 9, 19, 20 output a signal generated by microphone 23, and loudspeakers 7, 9, 17, 18 output a signal generated by microphone 24. In this manner, the possibility of verbal communication in a motor vehicle is supported. In this context, in principle, the more strongly a signal is amplified between one of microphones 21, 22, 23, 24 and one of loudspeakers 7, 9, 17, 18, 19, 20, the better is the communication may be. However, the possibility of implementing such an amplification is limited by possible feedback effects caused by sound radiated by a loudspeaker 7, 9, 17, 18, 19, 20, which is received by microphone 21, 22, 23, 24, and is subsequently amplified and radiated by loudspeaker 7, 9, 17, 18, 19, 20.

Figure 2:
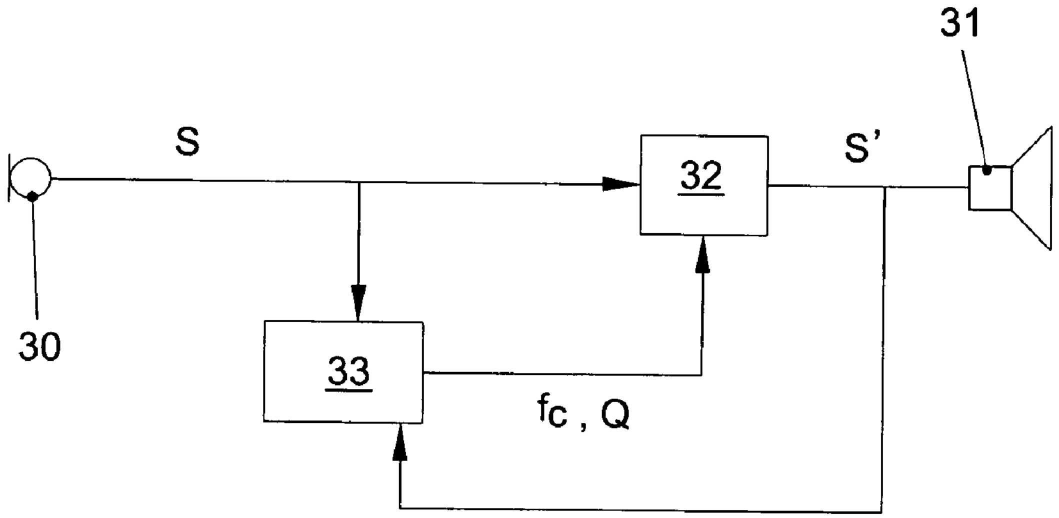
FIG. 2 schematically illustrates an exemplary embodiment of a device according to the present invention.

To reduce such a feedback, in accordance with the example embodiment illustrated in FIG. 2, a bandpass filter 32 is arranged between a microphone 30, which may be one of microphones 21, 22, 23, 24, and a loudspeaker 31, which may be one of loudspeakers 7, 9, 17, 18, 19, 20. This filters a signal S generated by microphone 30 and supplies a filtered signal S', which has certain frequency ranges filtered out, for which a decision logic 33 had recognized the danger of feedback. To this end, decision logic 33 determines filter parameters $f_c$ and Q, which are used to adjust bandpass filter 32.

To amplify signal S and/or signal S', amplifiers may be provided. However, the amplifier function may also be provided by the bandpass filter.

Figure 3:
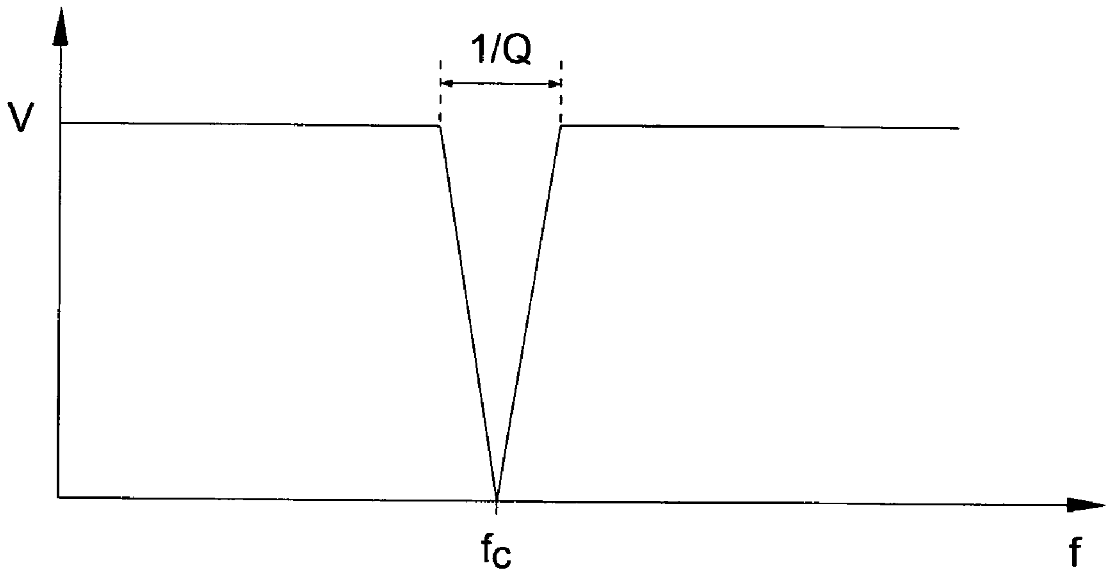
FIG. 3 schematically illustrates a notch filter.
Figure 4:
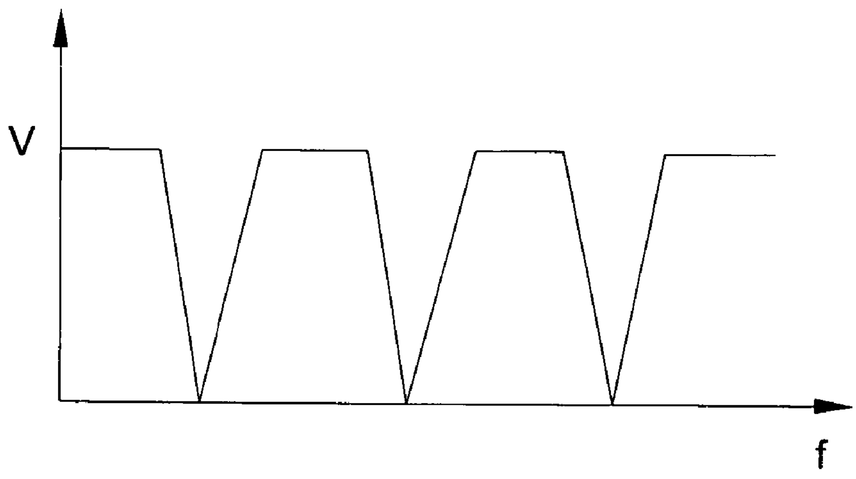
FIG. 4 schematically illustrates a filter bank.

FIG. 3 illustrates the characteristic curve of a bandpass filter designed as a notch filter, amplification V of the bandpass filter being plotted against frequency f. In this context, $f_c$ indicates the mid-frequency of the bandpass filter and Q its quality. To filter a plurality of frequency ranges, bandpass filter 32 may be arranged as a filter bank, as illustrated in FIG. 4. The filter bank may include up to 10 notch filters.

Figure 5:
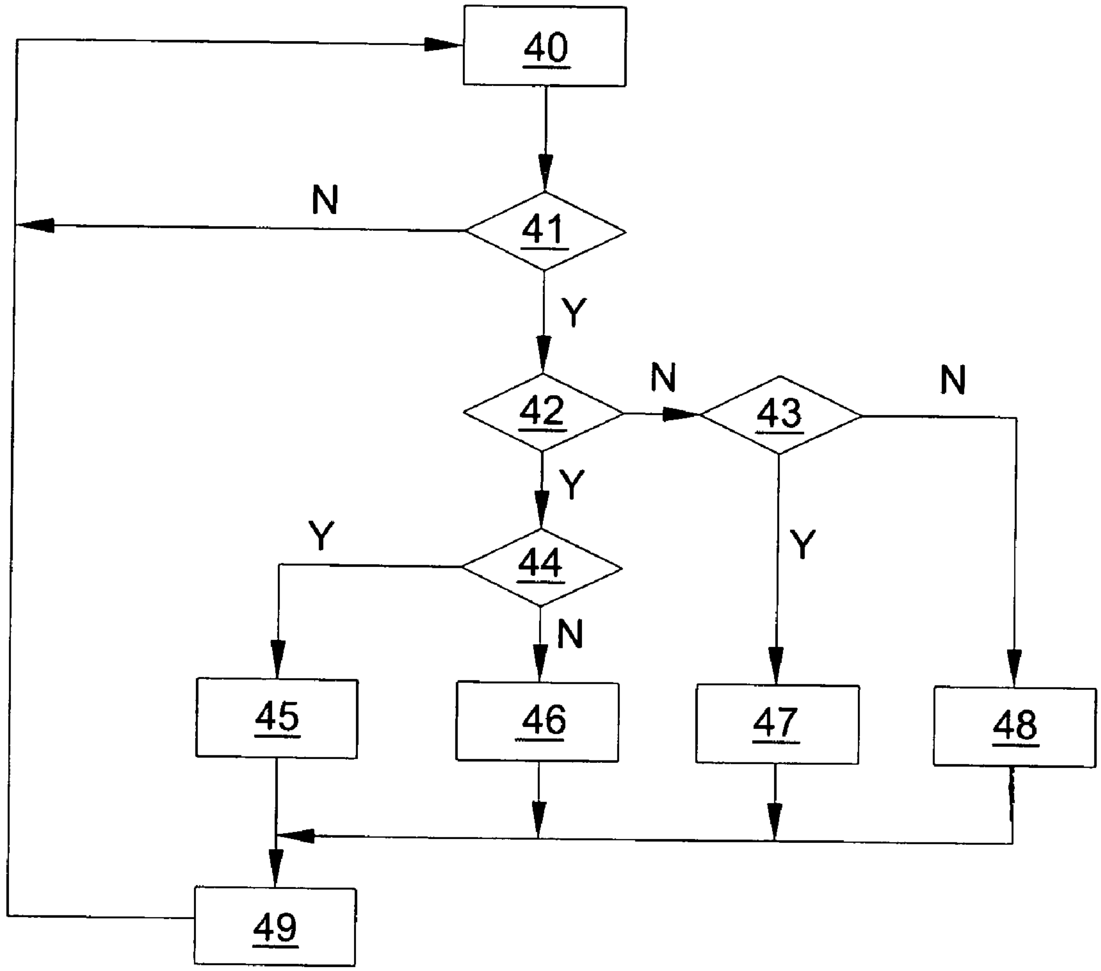
FIG. 5 schematically illustrates an exemplary embodiment for a flow diagram implemented in a decision logic.
Figure 6:
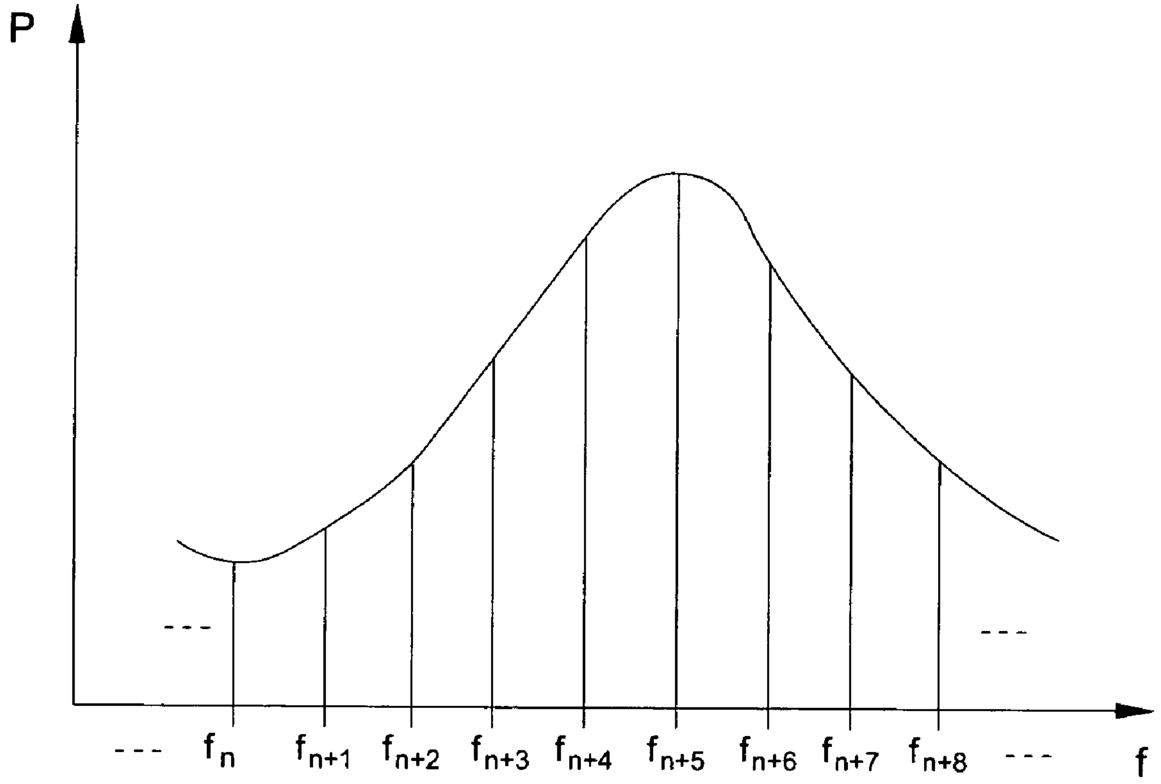
FIG. 6 schematically illustrates an power-frequency diagram.

FIG. 5 illustrates an exemplary embodiment for a flow diagram implemented in a decision logic 33. In this context, frequency f of signal S is first analyzed in a step 40, and, as illustrated exemplarily in FIG. 6, power P of signal S is determined at, e.g., 192, different test frequencies $f_n$, $f_{n+1}$, $f_{n+2}$, $f_{n+3}$, $f_{n+4}$, $f_{n+5}$, $f_{n+6}$, $f_{n+7}$, $f_{n+8}$, which are spaced apart by, e.g., 40 Hz.

It may be provided to average over time the power at test frequencies $f_n$, $f_{n+1}$, $f_{n+2}$, $f_{n+3}$, $f_{n+4}$, $f_{n+5}$, $f_{n+6}$, $f_{n+7}$, $f_{n+8}$ i.e., to develop an average over time, and to test this average value over time of the power instead of the current power of signal S at test frequencies $f_n$, $f_{n+1}$, $f_{n+2}$, $f_{n+3}$, $f_{n+4}$, $f_{n+5}$, $f_{n+6}$, $f_{n+7}$, $f_{n+8}$. The foregoing may consequently also include the average value of the power developed over a certain time period. Furthermore, power in the present context may include the amplitude or its average value over time. In the present context, further modifications of power, amplitude or their average values over time may also be included, such as normalized values. Thus, for instance, by the power of signal S at a test frequency $f_n$ in the present context, the value of the power of signal S at this test frequency $f_n$ divided by the sum of the power of signal S at all test frequencies $f_n$, $f_{n+1}$, $f_{n+2}$, $f_{n+3}$, $f_{n+4}$, $f_{n+5}$, $f_{n+6}$, $f_{n+7}$, $f_{n+8}$ may be understood.

Step 40 is followed by interrogation 41, e.g., whether the danger of feedback exists at a test frequency $f_n$, $f_{n+1}$, $f_{n+2}$, $f_{n+3}$, $f_{n+4}$, $f_{n+5}$, $f_{n+6}$, $f_{n+7}$, $f_{n+8}$. Details pertaining to this query are explained with respect to FIG. 7. Provided there is no danger of feedback for any test frequency $f_n$, $f_{n+1}$, $f_{n+2}$, $f_{n+3}$, $f_{n+4}$, $f_{n+5}$, $f_{n+6}$, $f_{n+7}$, $f_{n+8}$, step 40 follows interrogation 41. If, however, the danger of feedback does exist for a test frequency $f_n$, $f_{n+1}$, $f_{n+2}$, $f_{n+3}$, $f_{n+4}$, $f_{n+5}$, $f_{n+6}$, $f_{n+7}$, $f_{n+8}$, then an interrogation 42 follows interrogation 41, e.g., whether signal S generated by microphone 30 has already been reduced, with the aid of the bandpass filter, in the environs of this test frequency.

If signal S generated by microphone 30 has not already been reduced by the bandpass filter, by signal components around the test frequency, then query 42 is followed by an interrogation 43, e.g., whether a bandpass filter is available. If a bandpass filter is available, interrogation 43 is followed by a step 47, in which a bandpass filter is selected and the filter parameters, i.e., the mid-frequency $f_c$ and the quality Q of the bandpass filter, are generated. The mid-frequency $f_c$ is an example of the notch frequency. The notch frequency may be particularly the frequency range about the mid-frequency $f_c$, which the bandpass filter actually filters out of signal S generated by microphone 30.

Mid-frequency $f_c$ may, for example, be equated to the test frequency, for which feedback has been established. In an example embodiment of the present invention, mid-frequency $f_c$ may also be a test frequency having a correction frequency added to it. This correction frequency is formed, for example, as a function of the power of the signal generated by the microphone at the test frequency at which the power generated by the microphone is a maximum, as well as of the power of the signal generated by the microphone at least one test frequency next to this test frequency. Thus, the correction frequency may be generated in accordance with:

$$fkorr=\text{sign}*f\text{dist}*P\text{maxneigh}/(P\text{max}+P\text{maxneigh});$$

in which:

fkorr represents the correction frequency;

fdist represents the distance between the test frequency at which the power of the signal generated by the microphone is a maximum, and a test frequency having the greatest power which is directly next to the test frequency at which the power of the signal generated by the microphone is a maximum;

Pmax represents the power of the signal generated by the microphone at the test frequency at which the power of the signal generated by the microphone is a maximum;

Pmaxneigh represents the power of the signal generated by the microphone at the test frequency having the greatest power directly next to the test frequency at which the power of the signal generated by the microphone is a maximum; and sign represents a sign;

the sign being positive when the test frequency, having the greatest power directly next to the test frequency at which the power of the signal generated by the microphone is a maximum, is greater than the test frequency at which the power of the signal generated by the microphone is a maximum, and the sign otherwise being negative.

This is explained in greater detail in the light of the following example:

192 test frequencies $f_1$, $f_2$, . . . $f_{192}$ are assumed. $f_1$ is equal to 40 Hz. fdist is 40 Hz for all test frequencies. In addition, for the powers of the signals generated by the microphone at test frequencies $f\mathbf{1}_1$, $f_2$, . . . $f_{192}$, it is true that:

$$P(f_1, f_2, \ldots f_{94})=1$$

$$P(f_{95})=4$$

$$P(f_{96})=16$$

$$P(f_{97})=2$$

$$P(f_{94}, f_{99}, \ldots f_{192})=1$$

Then it is true that $$fkorr=(-)*40\text{Hz}*4/(16+2)=-8\text{Hz}$$

The test frequency at which the power of the signal generated by the microphone is a maximum, is consequently 3840 Hz, and the notch frequency is 3832 Hz.

The correction frequency may also be formed according to:

$$fkorr=\Delta f*(P\text{neighright}-P\text{neighleft})/(P\text{max}+|P\text{neighright}-P\text{neighleft}|),$$

in which:

fkorr represents the correction frequency;

Δf represents the difference between two test frequencies;

Pmax represents the power of the signal generated by the microphone at the test frequency at which the power of the signal generated by the microphone is a maximum;

Pneighright represents the power of the signal generated by the microphone at the test frequency directly above the test frequency at which the power of the signal generated by the microphone is a maximum; and Pneighleft represents the power of the signal generated by the microphone at the test frequency directly below the test frequency at which the power of the signal generated by the microphone is a maximum.

Based on the above numerical example, it is true in this case that:

$$fkorr=40\text{Hz}*(2-4)/(16+|4-2|)=-4.44\text{Hz}$$

The test frequency, at which the power of the signal generated by the microphone is a maximum, is consequently 3840 Hz and the notch frequency is 3835.56 Hz.

Quality Q is adjusted to a predefined value of, for example, 1/40 Hz.

If query 43 results in the statement that no bandpass filter is available, query 43 is followed by a step 48, in which the power of signal S is reduced by a reduction factor which may be between 2 dB and 5 dB, e.g., at essentially 3 dB.

If the result of query 42 is that signal S generated by microphone 30 is already being reduced with the aid of the bandpass filter by signal portions around the test frequency, a query 44 follows query 42. Using query 44, the question is whether by a further widening of the frequency range in which the bandpass filter blocks, that is, by a further reduction of its quality Q, a predetermined minimum quality may be undershot.

If by a further widening of the frequency range a predetermined minimum quality may be undershot, query 44 is followed by a step 45, and otherwise by a step 46. In step 45, which corresponds to step 48, the power of signal S is reduced by a reduction factor, which may be between 2 dB and 5 dB, e.g., at essentially 3 dB. In step 46 quality Q is reduced, i.e., the bandpass filter is widened.

After steps 45, 46, 47 and 48 there is a step 49 in which a time between 0.1 s and 3 s is expected.

Figure 7:
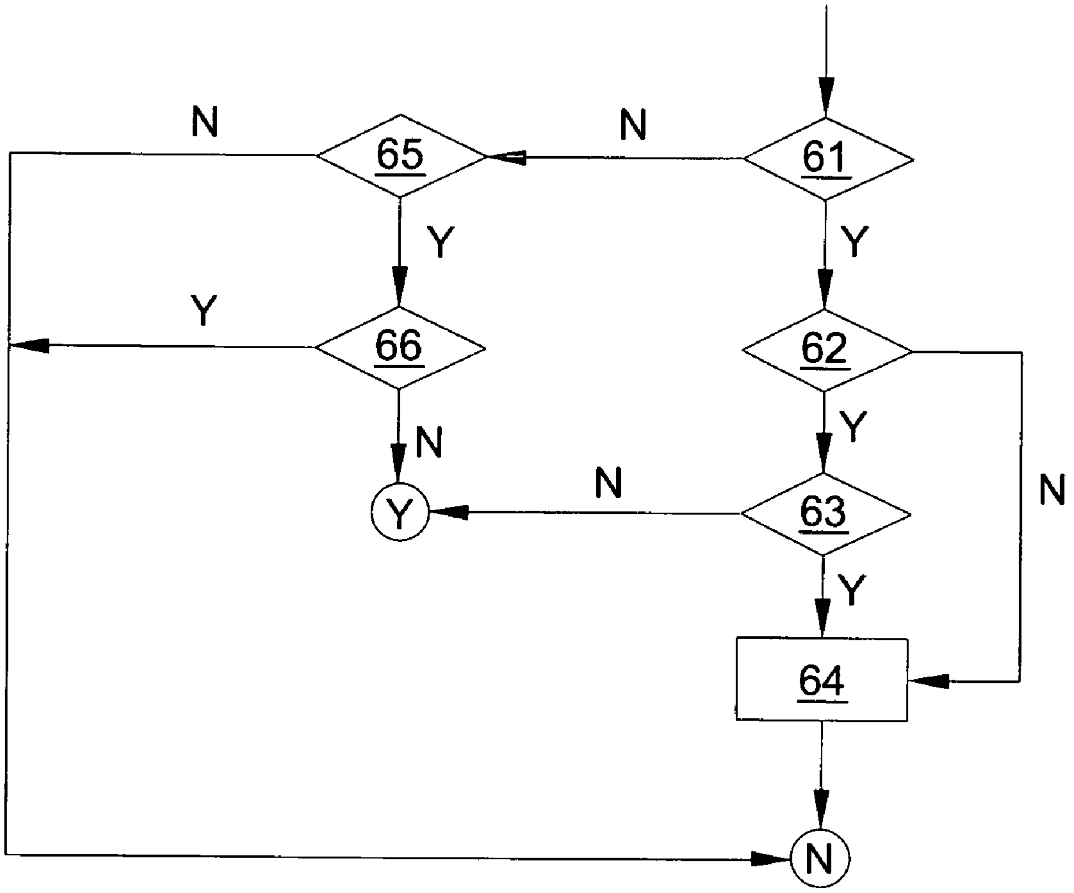
FIG. 7 schematically illustrates an exemplary embodiment of query 41 in FIG. 5.

FIG. 7 illustrates an exemplary embodiment for query 41. In this context, first a query 61 is provided as to whether the power of output signal S' of bandpass filter 32 exceeds an output threshold value. If the power of output signal S' of bandpass filter 32 exceeds the output threshold, query 61 is followed by a query 62, as to whether, for example, the ratio PowerRatio3:

of the power MaxBinPwrPlusNeighbor of signal S generated by microphone 30 is a maximum at the frequency at which the power of the signal generated by the microphone is a maximum, plus the power of signal S generated by microphone 30 at the test frequency of signal S generated by microphone 30:

which is directly adjacent to the test frequency at which the power of signal S generated by microphone 30 is a maximum; and at which the power is greater than at a test frequency which is also directly adjacent to the test frequency at which the power of signal S generated by microphone 30 is a maximum to the average value MeanBinPwrRemainder of the power of signal S generated by microphone 30 of all additional test frequencies of signal S generated by microphone 30 is greater than a feedback-power threshold OutGrdRatioThreshold.

Using query 62, e.g., as provided by this exemplary embodiment, the question is put whether the ratio PowerRatio3:

of the power MaxBinPwrPlusNeighbor of signal S generated by microphone 30 at the frequency at which the power of signal S generated by microphone 30 is a maximum, plus the power of signal S generated by microphone 30 at the test frequency of signal S generated by microphone 30:

which is directly adjacent to the test frequency at which the power of signal S generated by microphone 30 is a maximum; and at which the power is greater than at a test frequency which is also directly adjacent to the test frequency at which the power of signal S generated by microphone 30 is a maximum to the average value MeanBinPwrRemainder of the power of signal S generated by microphone 30 of all additional test frequencies of signal S generated by microphone 30 is greater than a feedback-power threshold OutGrdRatioThreshold for longer than a time-ratio-threshold OutBinRatioTimeThreshold. The feedback-power threshold OutGrdRatioThreshold may be between 30 and 40.

It may be provided that query 62 is only answered affirmatively if the global maximum is at a test frequency for longer than a time threshold OutGrdMaxBinTimeThreshold.

To carry out query 62, first of all the local maxima are determined. For this purpose, first of all (for the test frequencies) the first derivative of the power of Signal S with respect to frequency f is determined. From the first derivative of the power of signal S with respect to frequency f a slope signal is subsequently formed, which assumes a first binary value when the first derivative of the power of signal S with respect to the frequency f is greater than or equal to zero, and which assumes a second binary value when the first derivative of the power of signal S with respect to frequency f is less than zero. Subsequently, the first derivative of the slope signal is ascertained. In this context, in an example embodiment of the present invention, the presence of a local maximum of the power of signal S as a function of frequency f is only assumed if the first derivative of the slope signal is less than zero.

TABLE 1

```
function idx_vec = FinfInfletions(x, flec_thresh)
dtdx = diff(x);
dtdx = dtdx > 0;
dt2dx = diff(dtdx);
idx_vec = find(dt2dx < flec_thresh);
idx_vec = idx_vec + 1;
```

In this context, Table 1 shows an exemplary embodiment of a program written in the language Matlab™, which ascertains the indices idx_vec of the test frequencies at which there are local maxima according to criteria mentioned above. In this context, x denotes a vector having the powers at the individual test frequencies, and flec_thresh denotes a value between 0 and −1.

The local maximum having the greatest power is regarded as the global maximum.

If query 62 is answered in the affirmative, then query 62 is followed by a query 63, and otherwise by a step 64.

By query 63, the question is put as to whether signal S has a strong harmonic component. For this purpose, in an exemplary embodiment, the question is put whether the ratio:

of the power of signal S generated by microphone 30 at the test frequency, at which the power of signal S generated by microphone 30 is a maximum to the average value of the power of signal S generated by microphone 30 at all further test frequencies at which the power of signal S generated by microphone 30 has a local maximum is less than or equal to an additional power threshold RichContentThreshold.

If query 63 reveals that the ratio:

of the power of signal S generated by microphone 30 at the test frequency, at which the power of signal S generated by microphone 30 is a maximum to the average value of the power of signal S generated by microphone 30 at all further test frequencies at which the power of signal S generated by microphone 30 has a local maximum is less than or equal to an additional power threshold RichContentThreshold, then query 63 is followed by step 64. Otherwise, feedback is assumed.

In step 64, the sequence is stopped for a predetermined retention time, such as 3 s. After the expiration of the retention time, feedback is negated.

If query 61 yields that the power of output signal S' of bandpass filter 32 does not exceed the output threshold, then query 61 is followed by query 65 which essentially corresponds to query 62. In this context, however, a different feedback power threshold RatioThresholdis used, and not OutGrdRatioThreshold. However, the feedback-power threshold RatioThreshold may also be between 30 and 40.

If query 65 is answered affirmatively, then query 65 is followed by query 66 corresponding to query 63. Otherwise the presence of feedback is negated.

If query 66 reveals that the ratio:

of the power of signal S generated by microphone 30 at the test frequency, at which the power of signal S generated by microphone 30 is a maximum to the average value of the power of signal S generated by microphone 30 at all further test frequencies at which the power of signal S generated by microphone 30 has a local maximum is less than or equal to an additional power threshold RichContentThreshold, then the presence of feedback is negated. Otherwise, feedback is assumed.

The feedback detection is not limited to the example embodiment described above. The feedback detection may, for example, be constituted so that only query 65 is provided. The detection of feedback may also be provided so as to replace the example embodiments in accordance with FIG. 7 and its binary decision logic by a fuzzy decision logic, e.g., fuzzy logic, or neural networks.

Query 63 as in FIG. 7 will be explained below in the light of two signals 80 and 90 illustrated in FIGS. 8 and 9 in a power-frequency diagram. Power P of signals 80 and 90 is plotted in dB against the index idx_vec of the test frequencies. It is assumed that query 61 yields for both signals 80 and 90 that the power of output signal S' of bandpass filter 32 exceeds the output threshold, and that therefore query 62 follows query 61. It is assumed further that query 62 receives an affirmative response. The + signs in FIG. 8 and FIG. 9 denote all test frequencies which have been recognized by the program according to Table 1 as local/global maxima.

Figure 8:
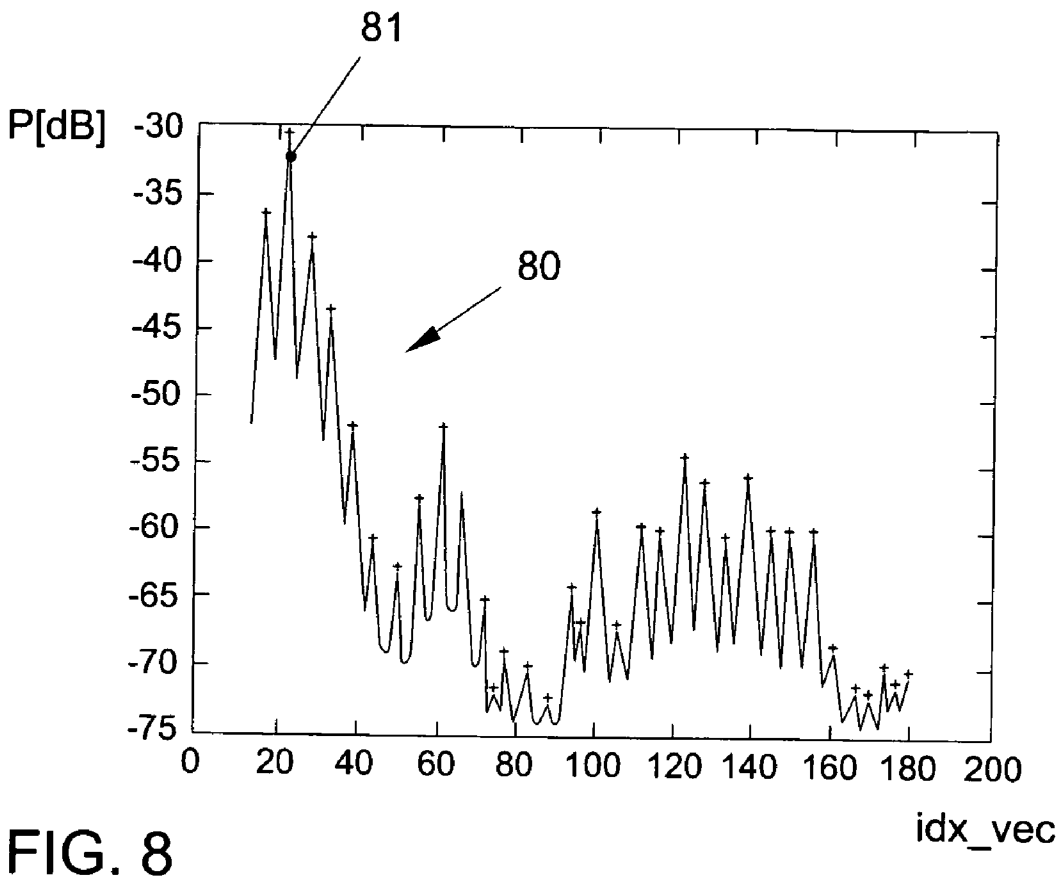
FIG. 8 is a schematic power-frequency diagram.
Figure 9:
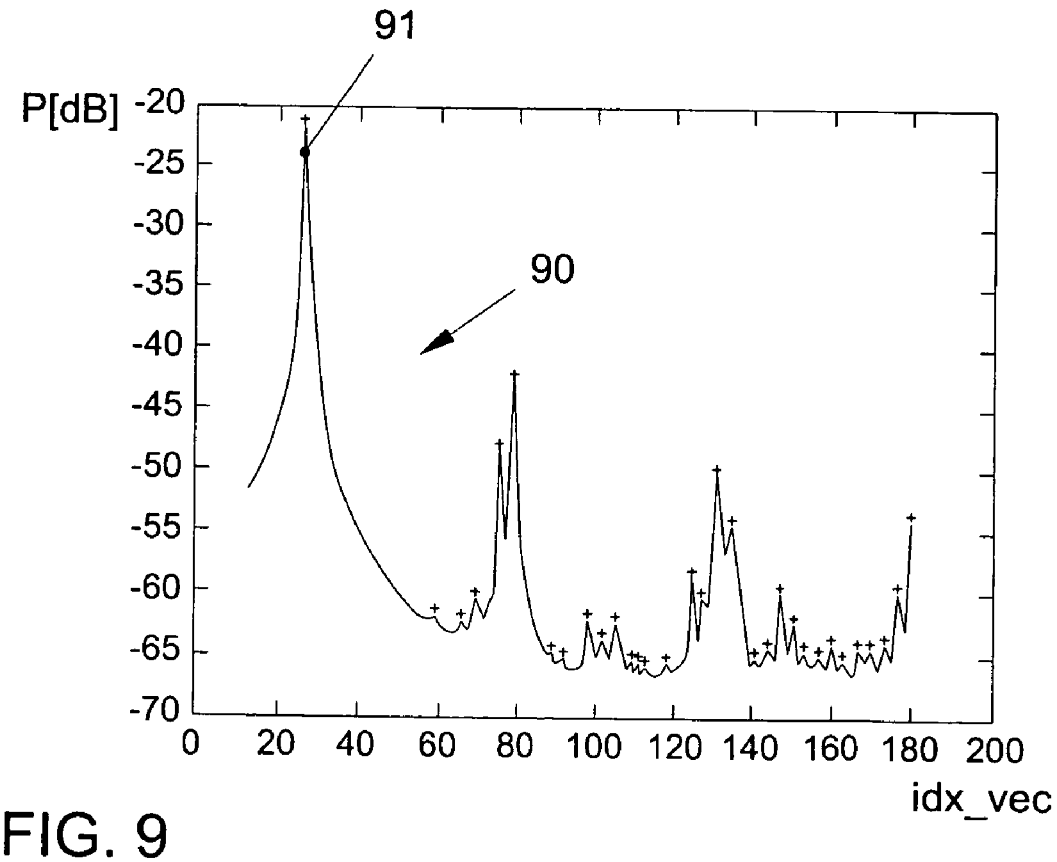
FIG. 9 is a schematic power-frequency diagram.

In FIG. 8, reference numeral 81 indicates the global maximum of signal 80. In FIG. 9, reference numeral 91 indicates the global maximum of signal 90. The test frequencies have a separation distance of 40 Hz. The additional power threshold RichContentThreshold amounts to 37.

The ratio:

of the power of signal 80 at the test frequency at which the power of signal 80 is a maximum to the average value of the power of signal 80 at all further test frequencies at which the power of signal 80 has a local maximum amounts to approximately 16, and is consequently clearly less than 37. Thus, query 63 would be answered affirmatively, and so the presence of feedback would be negated.

The ratio:

of the power of signal 90 at the test frequency at which the power of signal 90 is a maximum to the average value of the power of signal 90 at all further test frequencies at which the power of signal 90 has a local maximum amounts to approximately 73, and is consequently clearly greater than 37. Thus, query 63 would be negated and so the presence of feedback would be assumed.

REFERENCE NUMERAL LIST

| | |
|---|---|
| 1 | motor vehicle |
| 2, 3 | front seats |
| 4, 5, 6 | rear seats |
| 7, 8, 9, 10, 11, 12, 13, 14, 15, 16, 17, 18, 19, 20, 31 | loudspeakers |
| 21, 22, 23, 24, 30 | microphones |
| 32, | bandpass filter |
| 33 | decision logic |
| 40, 45, 46, 47, 48, 49, 64 | steps |
| 41, 42, 43, 44, 61, 62, 63, 65, 66 | queries |
| 80, 90 | signal |
| 81, 91 | global maximum |
| BinRatioTimeThreshold | time ratio threshold |
| f | frequency |
| $f_n$, $f_{n+1}$, $f_{n+2}$, $f_{n+3}$, $f_{n+4}$, $f_{n+5}$, $f_{n+6}$, $f_{n+7}$, $f_{n+8}$, $f_1$, $f_2$, $f_{44}$, $f_{88}$, $f_{94}$, $f_{95}$, $f_{97}$, $f_{98}$, $f_{122}$, $f_{192}$, | frequency points |
| $f_c$ | mid-frequency |
| fdist | distance between the test frequency at which the power of the signal generated by the microphone is a maximum, and a test frequency having the greatest power directly next to the test frequency at which the power of the signal generated by the microphone is a maximum |
| fkorr | correction frequency |
| MaxBinPwrPlusNeighbor | the power of the signal generated by the microphone at the frequency at which the power of the signal generated by the microphone is a maximum, plus the power of the signal generated by the microphone at the frequency of the signal generated by the microphone which is directly adjacent to the frequency at which the power of the signal generated by the microphone is a maximum, and at which the power of the signal generated by the microphone is greater than at a frequency |

-continued

REFERENCE NUMERAL LIST

| | |
|---|---|
| | which is also directly adjacent to a frequency at which the power of the signal generated by the microphone is a maximum |
| MeanBinPwrRemainder | average value of the power of the signal generated by the microphone of all further (tested) frequencies |
| Q | quality |
| OutGrdRatioThreshold, RatioThreshold | feedback-power threshold |
| P | power |
| PMax | the power of the signal generated by the microphone at the test frequency at which the power of the signal generated by the microphone is a maximum |
| Pmaxneigh | the power of the signal generated by the microphone at which the test frequency having the greatest power directly adjacent to the test frequency at which the power of the signal generated by the microphone is a maximum |
| Pneighleft | the power of the signal generated by the microphone at the test frequency directly below the test frequency at which the power of the signal generated by the microphone is a maximum |
| Pneighright | the power of the signal generated by the microphone at the test frequency directly above the test frequency at which the power of the signal generated by the microphone is a maximum |
| PowerRatio3 | power ratio |
| RichContentThreshold | additional power threshold |
| S | signal |
| S' | filtered signal |
| sign | sign |
| V | amplification |
| Δf | interval between two test frequencies |

What is claimed is:

1. A method for operating a voice-supported system in a motor vehicle, the system including at least one microphone, at least one loudspeaker, and a bandpass filter arranged between the microphone and the loudspeaker, comprising:

determining a power of a microphone signal as a function of frequency;

adjusting the bandpass filter at least as a function of a derivative of the power of the microphone signal with respect to frequency; and determining a local maximum of the power of the microphone signal as a function of the derivative of the power of the microphone signal with respect to frequency.

2. The method according to claim 1, wherein the voice-supported system includes at least one of a communications device, an intercom device, a two-way intercom device, and a duplex telephony device.

3. A method for operating a voice-supported system in a motor vehicle, the system including at least one microphone, at least one loudspeaker, and a bandpass filter arranged between the microphone and the loudspeaker, comprising:

determining a power of a microphone signal as a function of frequency;

adjusting the bandpass filter at least one of as a function of at least one local maximum of the power of the microphone signal as a function of the frequency and as a function of a derivative of the power of the microphone signal with respect to frequency; and determining the local maximum of the power of the microphone signal as a function of the derivative of the power of the microphone signal with respect to frequency.

4. A method for operating a voice-supported system in a motor vehicle, the system including at least one microphone, at least one loudspeaker, and a bandpass filter arranged between the microphone and the loudspeaker, comprising:

determining a power of a microphone signal as a function of frequency;

adjusting the bandpass filter at least one of as a function of at least one local maximum of the power of the microphone signal as a function of the frequency and as a function of a derivative of the power of the microphone signal with respect to frequency; and determining the local maximum of the power of the microphone signal as a function of a first derivative of the power of the microphone signal with respect to frequency.

5. A method for operating a voice-supported system in a motor vehicle, the system including at least one microphone, at least one loudspeaker, and a bandpass filter arranged between the microphone and the loudspeaker, comprising:

determining a power of a microphone signal as a function of frequency;

adjusting the bandpass filter at least one of as a function of at least one local maximum of the power of the microphone signal as a function of the frequency and as a function of a derivative of the power of the microphone signal with respect to frequency;

forming a slope signal from a first derivative of the power of the microphone signal with respect to the frequency having a first binary value when the first derivative of the power of the microphone signal with respect to frequency is greater than or equal to zero and a second binary value when the first derivative of the power of the microphone signal with respect to frequency is less than zero; and determining the local maximum of the power of the microphone signal as a function of a first derivative of the slope signal.

6. A method for operating a voice-supported system in a motor vehicle, the system including at least one microphone, at least one loudspeaker, and a bandpass filter arranged between the microphone and the loudspeaker, comprising:

determining a power of a microphone signal as a function of frequency; and adjusting the bandpass filter at least one of as a function of at least one local maximum of the power of the microphone signal as a function of the frequency and as a function of a derivative of the power of the microphone signal with respect to frequency;

wherein the bandpass filter is adjusted in the adjusting step as a function of a first derivative of the power of the microphone signal with respect to frequency.

7. A method for operating a voice-supported system in a motor vehicle, the system including at least one microphone, at least one loudspeaker, and a bandpass filter arranged between the microphone and the loudspeaker, comprising:

determining a power of a microphone signal as a function of frequency;

adjusting the bandpass filter at least one of as a function of at least one local maximum of the power of the microphone signal as a function of the frequency and as a function of a derivative of the power of the microphone signal with respect to frequency; and forming a slope signal having a first binary value when a first derivative of the power of the microphone signal with respect to frequency is greater than or equal to zero and a second binary value when the first derivative of the power of the microphone signal with respect to frequency is less than zero, the bandpass filter adjusted in the adjusting step as a function of the slope signal.

8. The method according to claim 7, wherein the bandpass filter is adjusted in the adjusting step as a function of a first derivative of the slope signal.

9. The method according to claim 1, further comprising determining all local maxima in one frequency range.

10. The method according to claim 9, further comprising determining a global maximum in the frequency range.

11. The method according to claim 1, wherein the bandpass filter is adjusted in the adjusting step to block a portion of the microphone signal at a notch frequency only when a ratio at least of the power of the microphone signal at a frequency at which the power of the microphone signal is a maximum to an average value of the power of the microphone signal at additional frequencies of the microphone signal is greater than a feedback-power threshold.

12. The method according to claim 1, wherein the bandpass filter is adjusted in the adjusting step to block a portion of the microphone signal at a notch frequency only when a ratio at least of the power of the microphone signal at a frequency at which the power of the microphone signal is a maximum to an average value of the power of the microphone signal at additional frequencies of the microphone signal is greater than a feedback-power threshold for longer than a time-ratio-threshold.

13. The method according to claim 1, wherein the bandpass filter is adjusted in the adjusting step to block a portion of the microphone signal at a notch frequency only when a ratio of the power of the microphone signal at a frequency at which the power of the microphone signal is a maximum plus the power of the microphone signal at frequencies of the microphone signal adjacent to the frequency at which the power of the microphone signal is a maximum to an average value of the power of the microphone signal at additional frequencies of the microphone signal is greater than a feedback-power threshold.

14. The method according to claim 1, wherein the bandpass filter is adjusted in the adjusting step to block a portion of the microphone signal at a notch frequency only when a ratio of the power of the microphone signal at a frequency at which the power of the microphone signal is a maximum plus the power of the microphone signal at frequencies of the microphone signal adjacent to the frequency at which the power of the microphone signal is a maximum to an average value of the power of the microphone signal at additional frequencies of the microphone signal is greater than a feedback-power threshold for longer than a time-ratio-threshold.

15. The method according to claim 1, wherein the bandpass filter is adjusted in the adjusting step to block a portion of the microphone signal at a notch frequency only when a ratio of the power of the microphone signal at a frequency at which the power of the microphone signal is a maximum plus the power of the microphone signal at a frequency of the microphone signal that is directly adjacent to the frequency at which the power of the microphone signal is a maximum and at which the power is greater than at a frequency that is also directly adjacent to the frequency at which the power of the microphone signal is a maximum to an average value of the power of the microphone signal at additional frequencies of the microphone signal is greater than a feedback-power threshold.

16. The method according to claim 1, wherein the bandpass filter is adjusted in the adjusting step to block a portion of the signal at a notch frequency only when a ratio of the power of the signal at a frequency at which the power of the signal is a maximum plus the power of the signal at a frequency of the signal that is directly adjacent to the frequency at which the power of the signal is a maximum and at which the power is greater than at a frequency that is also directly adjacent to the frequency at which the power of the signal is a maximum to an average value of the power of the signal at additional frequencies of the signal is greater than a feedback-power threshold for longer than a time-ratio-threshold.

17. The method according to claim 1, wherein the bandpass filter is adjusted in the adjusting step to block a portion of the signal at a notch frequency only when a ratio of the power of the signal at a frequency at which the power of the signal is a maximum plus the power of the signal at a frequency of the signal that is directly adjacent to the frequency at which the power of the signal is a maximum and at which the power is greater than at a frequency that is also directly adjacent to the frequency at which the power of the signal is a maximum to an average value of the power of the signal of all further frequencies of the signal is greater than a feedback-power threshold.

18. The method according to claim 1, wherein the bandpass filter is adjusted in the adjusting step to block a portion of the signal at a notch frequency only when a ratio of the power of the signal at a frequency at which the power of the signal is a maximum plus the power of the signal at a frequency of the signal that is directly adjacent to the frequency at which the power of the signal is a maximum and at which the power is greater than at a frequency that is also directly adjacent to the frequency at which the power of the signal is a maximum to an average value of the power of the signal of all additional frequencies of the signal is greater than a feedback-power threshold for longer than a time-ratio-threshold.

19. The method according to claim 11, further comprising determining the feedback-power threshold as a function of an output signal of the bandpass filter.

20. The method according to claim 11, wherein the feedback-power threshold is between 20 and 50.

21. The method according to claim 1, wherein the bandpass filter is adjusted in the adjusting step to block a portion of the signal at a notch frequency only when a ratio of the power of the signal at a frequency at which the power of the signal is a maximum to an average value of the power of the signal at further frequencies at which the power of the signal includes a local maximum is greater than a power threshold.

22. The method according to claim 1, wherein the bandpass filter is adjusted in the adjusting step to block a portion of the signal at a notch frequency only when a ratio of the power of the signal at a frequency at which the power of the signal is a maximum to an average value of the power of the signal at all further frequencies at which the power of the signal includes a local maximum is greater than a power threshold.

23. The method according to claim 21, wherein the power threshold is one of between 20 and 50 and between 30 and 40.

24. The method according to claim 22, wherein the power threshold is one of between 20 and 50 and between 30 and 40.

25. The method according to claim 1, wherein the bandpass filter is adjusted in the adjusting step as a function of an output signal.

26. A device for operating a voice-enhancement system, comprising:

at least one microphone;

at least one loudspeaker configured to reproduce a signal generated by the microphone;

a bandpass filter arranged between the microphone and the loudspeaker; and decision logic configured to adjust the bandpass filter at least as a function of a derivative of a power of the signal with respect to frequency.

27. The device according to claim 26, wherein the bandpass filter includes a filter bank having at least one notch filter.

28. The device according to claim 26, further comprising an arrangement configured to determine the power of the signal as a function of frequency.

29. A device for operating a voice-enhancement system, comprising:

at least one microphone;

at least one loudspeaker configured to reproduce a signal generated by the microphone;

a bandpass filter arranged between the microphone and the loudspeaker;

an arrangement configured to determine a power of the signal as a function of frequency; and an arrangement configured to adjust the bandpass filter at least as a function of a derivative of the power of the signal with respect to frequency.

30. A device for operating a voice-enhancement system, comprising:

at least one microphone;

at least one loudspeaker for reproducing a signal generated by the microphone;

a bandpass filter arranged between the microphone and the loudspeaker;

means for determining a power of the signal as a function of frequency; and means for adjusting the bandpass filter at least as a function of a derivative of the power of the signal with respect to frequency.

31. The method according to claim 1, wherein the bandpass filter is adjusted in the adjusting step as a function of the derivative of the power of the signal with respect to frequency and as a function of at least one local maximum of the power of the signal as a function of the frequency.

32. The device according to claim 26, wherein the decision logic is configured to adjust the bandpass filter as a function of the derivative of the power of the signal with respect to frequency and as a function of at least one local maximum of the power of the signal as a function of frequency.

33. The device according to claim 29, wherein the arrangement configured to adjust the bandpass filter is configured to adjust the bandpass filter as a function of the derivative of the power of the signal with respect to frequency and as a function of at least one local maximum of the power of the signal as a function of the frequency.

34. The device according to claim 30, wherein the bandpass filter adjusting means is for adjusting the bandpass filter as a function of the derivative of the power of the signal with respect to frequency and as a function of at least one local maximum of the power of the signal as a function of the frequency.

* * * * *